United States Patent
Hai et al.

(10) Patent No.: US 11,839,118 B2
(45) Date of Patent: Dec. 5, 2023

(54) ORGANIC LIGHT-EMITTING DISPLAY PANEL AND DISPLAY APPARATUS

(71) Applicant: BOE Technology Group Co., Ltd., Beijing (CN)

(72) Inventors: Xiaoquan Hai, Beijing (CN); Lei Wang, Beijing (CN); Xuan Liang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 283 days.

(21) Appl. No.: 17/419,889

(22) PCT Filed: Sep. 23, 2020

(86) PCT No.: PCT/CN2020/117192
§ 371 (c)(1),
(2) Date: Jun. 30, 2021

(87) PCT Pub. No.: WO2022/061602
PCT Pub. Date: Mar. 31, 2022

(65) Prior Publication Data
US 2022/0320222 A1 Oct. 6, 2022

(51) Int. Cl.
*G06V 40/13* (2022.01)
*H10K 59/126* (2023.01)
(Continued)

(52) U.S. Cl.
CPC ....... *H10K 59/126* (2023.02); *G06V 40/1318* (2022.01); *H10K 50/865* (2023.02);
(Continued)

(58) Field of Classification Search
CPC .............. G06V 40/1318; G06K 9/0004; H01L 27/3234; H01L 27/3227; H01L 25/167
See application file for complete search history.

(56) References Cited

U.S. PATENT DOCUMENTS

2018/0033835 A1\* 2/2018 Zeng ................. H10K 59/40
2019/0026530 A1\* 1/2019 Wu .................. G06V 40/1324
(Continued)

FOREIGN PATENT DOCUMENTS

CN 107423728 A \* 12/2017 ......... G06K 9/00046
CN 108875699 A \* 11/2018 ........... G06K 9/0004
(Continued)

*Primary Examiner* — Yuzhen Shen
(74) *Attorney, Agent, or Firm* — ArentFox Schiff LLP; Michael Fainberg

(57) ABSTRACT

The organic light-emitting display panel includes: a base substrate having sub-pixel regions and non-sub-pixel regions; fingerprint identification devices in the non-sub-pixel regions; anodes in the sub-pixel regions and on sides, facing away from the base substrate, of the fingerprint identification devices; and a collimation structure in the non-sub-pixel regions. The collimation structure includes at least two laminated light-shielding layers on the sides, facing away from the base substrate, of the fingerprint identification devices, and an orthographic projection of each light-shielding layer on the base substrate at least covers orthographic projections of the fingerprint identification devices on the base substrate; at least one through hole is in a position, corresponding to each fingerprint identification device, of each light-shielding layer, and through holes of the light-shielding layers are in one-to-one correspondence; and the light-shielding layer closest to the base substrate is disposed in the same layer as and insulated from the anodes.

15 Claims, 8 Drawing Sheets

(51) Int. Cl.
*H10K 50/86* (2023.01)
*H10K 59/65* (2023.01)
H10K 59/35 (2023.01)
H10K 59/122 (2023.01)

(52) U.S. Cl.
CPC ........... *H10K 59/65* (2023.02); *H10K 59/122* (2023.02); *H10K 59/35* (2023.02)

(56) References Cited

U.S. PATENT DOCUMENTS

| | | | |
|---|---|---|---|
| 2019/0243154 A1* | 8/2019 | Hai | G06V 40/1318 |
| 2020/0012832 A1* | 1/2020 | Yue | G06V 40/1318 |
| 2020/0184178 A1* | 6/2020 | Zhou | H10K 59/65 |
| 2021/0357616 A1* | 11/2021 | Gu | G06V 40/1324 |
| 2021/0367020 A1* | 11/2021 | Bok | H10K 59/126 |
| 2022/0067340 A1* | 3/2022 | Han | H10K 50/865 |

FOREIGN PATENT DOCUMENTS

| | | | | |
|---|---|---|---|---|
| CN | 110309775 A | | 10/2019 | |
| CN | 111240065 A | * | 6/2020 | ........... G02F 1/1333 |
| CN | 111240065 A | | 6/2020 | |
| CN | 111291719 A | | 6/2020 | |
| CN | 111626100 A | | 9/2020 | |
| WO | WO-2020107236 A1 | * | 6/2020 | ............. G06F 18/00 |

* cited by examiner

ORGANIC LIGHT-EMITTING DISPLAY PANEL AND DISPLAY APPARATUS

CROSS REFERENCE TO RELATED APPLICATIONS

This application is a national phase entry under 35 U.S.C. § 371 of International Application No. PCT/CN2020/117192, filed on Sep. 23, 2020, the entire content of which is incorporated herein by reference.

FIELD

The present disclosure relates to the technical field of display, in particular to an organic light-emitting display panel and a display apparatus.

BACKGROUND

An organic light-emitting display panel integrated fingerprint identification technology is a panel integrated technology that provides fingerprint identification capabilities without reducing the effective display area of the organic light-emitting display panel. The existing organic light-emitting display panel usually integrates an optical fingerprint identification unit. Light emitted from the organic light-emitting display panel is reflected on the surface of a finger and enters the organic light-emitting display panel again to be received by the fingerprint identification unit. The fingerprint identification unit can generate different identification information according to the difference in the reflection of light by valleys and ridges of a fingerprint, thereby being able to identify different fingerprint information.

SUMMARY

Embodiments of the present disclosure provide an organic light-emitting display panel, including:
- a base substrate having a plurality of sub-pixel regions and a plurality of non-sub-pixel regions located between the sub-pixel regions;
- a plurality of fingerprint identification devices located in the non-sub-pixel regions of the base substrate;
- a plurality of anodes located in the sub-pixel regions and located on sides, facing away from the base substrate, of the fingerprint identification devices; and
- a collimation structure located in the non-sub-pixel regions.

The collimation structure includes at least two laminated light-shielding layers. The at least two light-shielding layers are located on the sides, facing away from the base substrate, of the fingerprint identification devices. An orthographic projection of each light-shielding layer on the base substrate at least covers orthographic projections of the fingerprint identification devices on the base substrate. At least one through hole is located in a position, corresponding to each fingerprint identification device, of each light-shielding layer. The through holes, corresponding to the same fingerprint identification device, of the light-shielding layers are in one-to-one correspondence. The light-shielding layer closest to the base substrate is disposed in the same layer as and insulated from the anodes.

Optionally, in the organic light-emitting display panel provided by the embodiments of the present disclosure, the collimation structure includes a first light-shielding layer, a second light-shielding layer, and a third light-shielding layer which are laminated. The first light-shielding layer is close to the base substrate, the third light-shielding layer is away from the base substrate, and the first light-shielding layer is disposed in the same layer as and insulated from the anodes.

At least one first through hole is located in a position, corresponding to each fingerprint identification device, of the first light-shielding layer. At least one second through hole is located in a position, corresponding to each fingerprint identification device, of the second light-shielding layer. At least one third through hole is located in a position, corresponding to each fingerprint identification device, of the third light-shielding layer. The first through hole, the second through hole and the third through hole at the same position are in one-to-one correspondence.

Optionally, the organic light-emitting display panel provided by the embodiments of the present disclosure further includes a first encapsulation layer located on sides, facing away from the base substrate, of the anodes, and a second encapsulation layer located on a side, facing away from the base substrate, of the first encapsulation layer.

The second light-shielding layer is located between the first encapsulation layer and the second encapsulation layer, and the third light-shielding layer is located on a side, facing away from the base substrate, of the second encapsulation layer.

Optionally, in the organic light-emitting display panel provided by the embodiments of the present disclosure, the second light-shielding layer and the third light-shielding layer are made of a black matrix material.

Optionally, the organic light-emitting display panel provided by the embodiments of the present disclosure further includes a pixel defining layer located on sides, facing away from the base substrate, of the anodes. The pixel defining layer includes a colorful color resistance layer and a black color resistance layer which are laminated. The colorful color resistance layer is close to the anodes, and the black color resistance layer is away from the anodes. The pixel defining layer has opening regions in one-to-one correspondence with the sub-pixel regions. The black color resistance layer is multiplexed as the second light-shielding layer.

Optionally, the organic light-emitting display panel provided by the embodiments of the present disclosure further includes an encapsulation layer located on a side, facing away from the base substrate, of the pixel defining layer. The third light-shielding layer is located on a side, facing away from the base substrate, of the encapsulation layer.

Optionally, in the organic light-emitting display panel provided by the embodiments of the present disclosure, a light collection angle of the collimation structure is 10°-20°.

Optionally, in the organic light-emitting display panel provided by the embodiments of the present disclosure, the collimation structure satisfies an equation:

$$D(H1+H2)/2H1 \leq P1 \leq D(H1+H2)/2(H2-H1).$$

D is a width of the fingerprint identification device, $H1$ is a distance between a lower surface of the first light-shielding layer and a lower surface of the second light-shielding layer, $H2$ is a distance between the lower surface of the second light-shielding layer and an upper surface of the third light-shielding layer, and $P1$ is a distance between the through holes, in the adjacent non-sub-pixel regions, of the same light-shielding layer.

Optionally, in the organic light-emitting display panel provided by the embodiments of the present disclosure, diameters of the first through holes, the second through holes and the third through holes are the same, and are 1 μm-10 μm.

Optionally, in the organic light-emitting display panel provided by the embodiments of the present disclosure, a distance between the first light-shielding layer and the second light-shielding layer is 5 μm-10 μm, and a distance between the second light-shielding layer and the third light-shielding layer is 10 μm-30 μm.

Optionally, in the organic light-emitting display panel provided by the embodiments of the present disclosure, in the same light-shielding layer, a distance between the adjacent through holes is 20 μm-120 μm.

Optionally, in the organic light-emitting display panel provided by the embodiments of the present disclosure, a plurality of first through holes are located in the position, corresponding to each fingerprint identification device, of the first light-shielding layer, a plurality of second through holes are located in the position, corresponding to each fingerprint identification device, of the second light-shielding layer, and a plurality of third through holes are located in the position, corresponding to each fingerprint identification device, of the third light-shielding layer. The first through holes are uniformly distributed, the second through holes are uniformly distributed, and the third through holes are uniformly distributed.

Optionally, the organic light-emitting display panel provided by the embodiments of the present disclosure further includes a light-emitting layer located between the anodes and an encapsulation layer, a cathode located between the light-emitting layer and the encapsulation layer, and a spacer layer located between the pixel defining layer and the cathode.

Optionally, the organic light-emitting display panel provided by the embodiments of the present disclosure further includes a touch layer and a polarizer located on a side, facing away from the base substrate, of each light-shielding layer.

Optionally, the organic light-emitting display panel provided by the embodiments of the present disclosure further includes a driving circuit located between the base substrate and the fingerprint identification devices. The driving circuit includes a thin film transistor, and the thin film transistor is electrically connected to the fingerprint identification devices.

Correspondingly, embodiments of the present disclosure further provide a display apparatus including the organic light-emitting display panel provided by the embodiment of the present disclosure.

Optionally, the display apparatus provided by the embodiments of the present disclosure further includes a cover plate located on a side, facing away from a base substrate, of a polarizer, wherein the cover plate is a flexible cover plate.

DETAILED DESCRIPTION OF THE EMBODIMENTS

Figure 1:
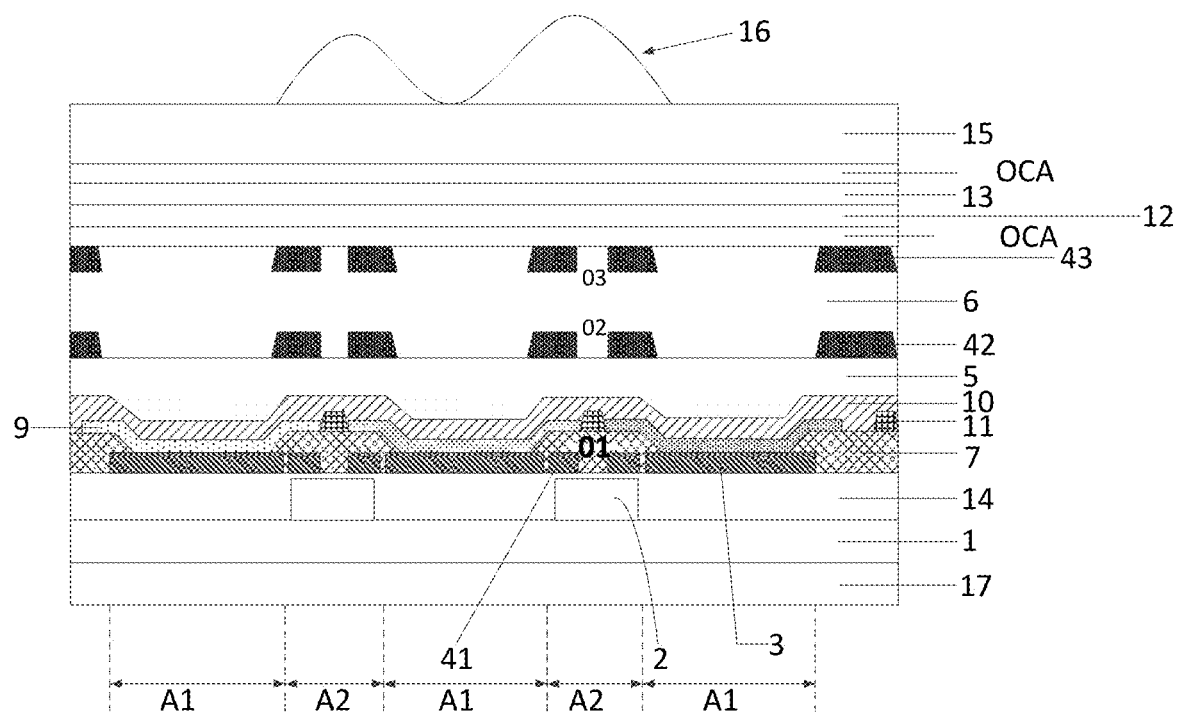
FIG. 1 is a schematic cross-sectional structure diagram of an organic light-emitting display panel provided by an embodiment of the present disclosure.

In order to make the objectives, technical solutions, and advantages of the embodiments of the present disclosure clearer, the technical solutions of the embodiments of the present disclosure will be described clearly and completely in combination with the accompanying drawings of the embodiments of the present disclosure. It is to be understood that the described embodiments are some, but not all, embodiments of the present disclosure. Also, embodiments and features in the embodiments of the disclosure may be combined with one another without conflict. Based on the described embodiments of the present disclosure, all other embodiments attainable by one of ordinary skill in the art without involving any inventive effort are within the scope of the present disclosure.

Unless otherwise defined, the technical terms or scientific terms used herein shall have the usual meanings understood by those with ordinary skills in the field to which this disclosure belongs. "Including" or "containing" and other similar words mean that an element or article that precedes the word is inclusive of the element or article listed after the word and equivalents thereof, but does not exclude other elements or articles. "Connecting" or "connected" and other similar words are not limited to physical or mechanical connection, and can also include electrical connections, regardless of direct or indirect connections. The terms "inner", "outer", "upper", "lower", and the like are used merely to denote a relative positional relationship that may change accordingly when the absolute position of the object being described changes.

It should be noted that the dimensions and shapes of the various figures in the drawings are not to scale and are intended to be merely illustrative of the contents of the present disclosure. The same or similar reference numerals refer to the same or similar elements or elements having the same or similar functions throughout.

In the related art, due to the ultra-thinness of organic light-emitting diode (OLED) modules, the fingerprint image area of the OLED In Cell point light source solution is relatively small, especially the edge of the fingerprint is very susceptible to strong light interference, so that an image is blurred, and the stitching effect is very poor. In addition, the fingerprint image of the light path of a point light source will cause the uneven distribution of the image illuminance due to the existence of a polarizer, the fingerprint is clear in some regions, and fingerprint signals in some regions are weak or even difficult to distinguish. At present, it is difficult to realize large-area fingerprint identification in the related art.

Figure 2:
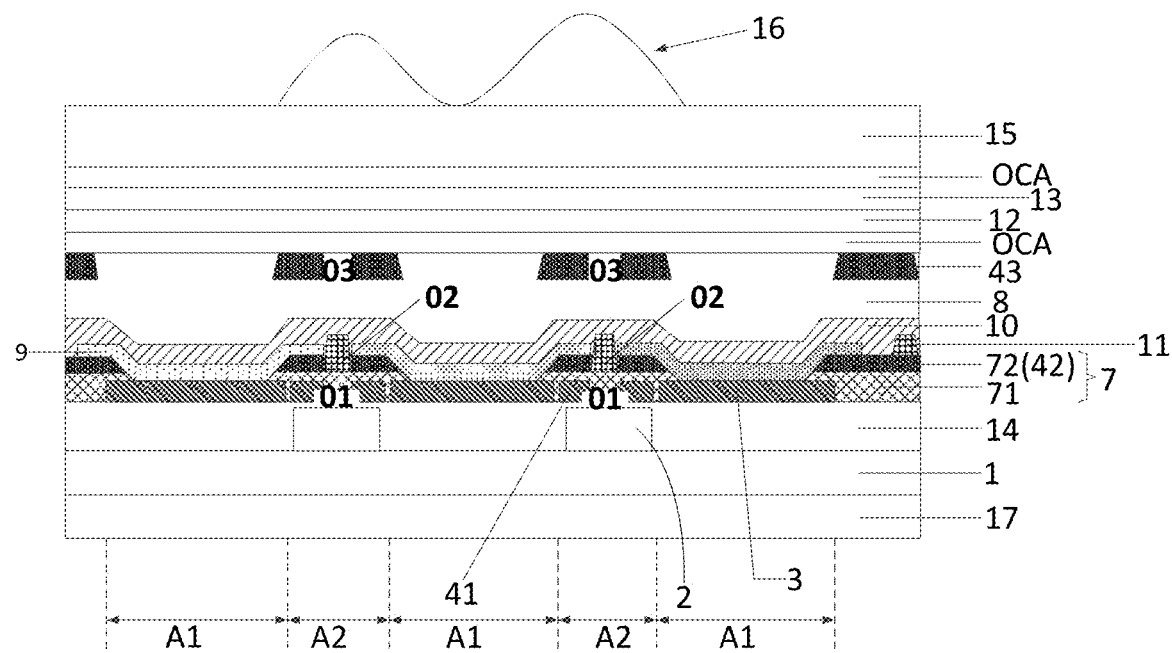
FIG. 2 is a schematic cross-sectional structure diagram of another organic light-emitting display panel provided by an embodiment of the present disclosure.

In view of this, embodiments of the present disclosure provide an organic light-emitting display panel as shown in FIGS. 1 and 2, including:
  a base substrate 1 provided with a plurality of sub-pixel regions A1 and a plurality of non-sub-pixel regions A2 located between the sub-pixel regions A1;
  a plurality of fingerprint identification devices 2 located in the non-sub-pixel regions A2 of the base substrate 1, specifically, the fingerprint identification devices 2 are located in the non-sub-pixel regions A2, and do not affect an aperture ratio of the organic light-emitting display panel, and the fingerprint identification devices 2 may be PIN diode structures;

a plurality of anodes 3 located in the sub-pixel regions A1 and located on sides, facing away from the base substrate 1, of the fingerprint identification devices 2; and a collimation structure located in the non-sub-pixel regions A2.

The collimation structure includes at least two laminated light-shielding layers (taking three light-shielding layers 41, 42 and 43 as an example). The at least two light-shielding layers (41, 42 and 43) are located on the sides, facing away from the base substrate 1, of the fingerprint identification devices 2. An orthographic projection of each light-shielding layer (41, 42 and 43) on the base substrate 1 at least covers orthographic projections of the fingerprint identification device 2 on the base substrate 1. At least one through hole is located in a position, corresponding to each fingerprint identification device 2, of each light-shielding layer (41, 42 and 43). For example, at least one through hole 01 (taking one through hole 01 as an example in FIGS. 1 and 2) is located in a position, corresponding to each fingerprint identification device 2, of the light-shielding layer 41; at least one through hole 02 (taking one through hole 02 as an example in FIGS. 1 and 2) is located in a position, corresponding to each fingerprint identification device 2, of the light-shielding layer 42; and at least one through hole 03 (taking one through hole 03 as an example in FIGS. 1 and 2) is located in a position, corresponding to each fingerprint identification device 2, of the light-shielding layer 43. The through holes (01, 02 and 03), corresponding to the same fingerprint identification device 2, of the light-shielding layers (41, 42 and 43) are in one-to-one correspondence. For example, the through hole 01 of the light-shielding layer 41, the through hole 02 of the light-shielding layer 42, and the through hole 03 of the light-shielding layer 43 corresponding to the same fingerprint identification device 2 are in one-to-one correspondence. The light-shielding layer 41 closest to the base substrate 1 is disposed in the same layer as and insulated from the anodes 3.

The above-mentioned organic light-emitting display panel provided by embodiments of the present disclosure adopts the at least two light-shielding layers with the through holes to form the collimation structure. The at least two through holes in one-to-one correspondence may screen out light reflected by a finger in an approximately collimated manner, and make the light reach the fingerprint identification devices below. The fingerprint identification devices may detect and read the intensity of the light. Because the valley and ridge of the fingerprint have different energies of downward transmitting the light, the light intensities detected by the fingerprint identification devices are different. In this way, the fingerprint information is obtained and the large-area fingerprint identification is realized. Moreover, when the collimation structure of the present disclosure has more than two light-shielding layers, a light collection angle of the collimation structure may be defined by a top light-shielding layer and a bottom light-shielding layer, and a middle light-shielding layer may be configured to shield light crosstalk of the through holes in the different non-sub-pixels regions, thereby improving the accuracy of the identified fingerprint information. In addition, because only by preparing the at least two light-shielding layers with the through holes with a relatively simple structure may a better collimation effect be obtained, and the light-shielding layer closest to the base substrate is disposed in the same layer as and insulated from the anodes, patterns of the bottom light-shielding layer and the anodes may be formed through a one-time patterning process, which simplifies the manufacturing process, saves production costs, and improves production efficiency.

In implementations, in the above-mentioned organic light-emitting display panel provided by the embodiments of the present disclosure, as shown in FIGS. 1 and 2, the collimation structure includes the first light-shielding layer 41, the second light-shielding layer 42, and the third light-shielding layer 43 which are laminated. The first light-shielding layer 41 is close to the base substrate 1, the third light-shielding layer 43 is away from the base substrate 1, and the first light-shielding layer 41 is located on the same layer as and insulated from the anodes 3. Thus, when the anodes 3 are formed, patterns of the first light-shielding layer 41 and the anodes 3 may be formed through a one-time patterning process by changing original patterns of composition without adding a separate process for preparing the first light-shielding layer 41, which may simplify the preparation process, save production costs, and improve production efficiency.

The at least one first through hole 01 (taking one first through hole 01 as an example in FIGS. 1 and 2) is located in the position, corresponding to each fingerprint identification device 2, of the first light-shielding layer 41, the at least one second through hole 02 (taking one second through hole 02 as an example in FIGS. 1 and 2) is located in the position, corresponding to each fingerprint identification device 2, of the second light-shielding layer 42, and the at least one third through hole 03 (taking one third through hole 03 as an example in FIGS. 1 and 2) is located in the position, corresponding to each fingerprint identification device 2, of the third light-shielding layer 43. The first through hole 01, the second through hole 02, and the third through hole 03 at the same position are in one-to-one correspondence. Through optical design, the first through hole 01, the second through hole 02, and the third through hole 03 may have a collimating function, and may screen out light reflected by the finger in an approximately collimated manner to make the light reach the fingerprint identification device 2 below, so as to realize fingerprint identification.

Figure 3:
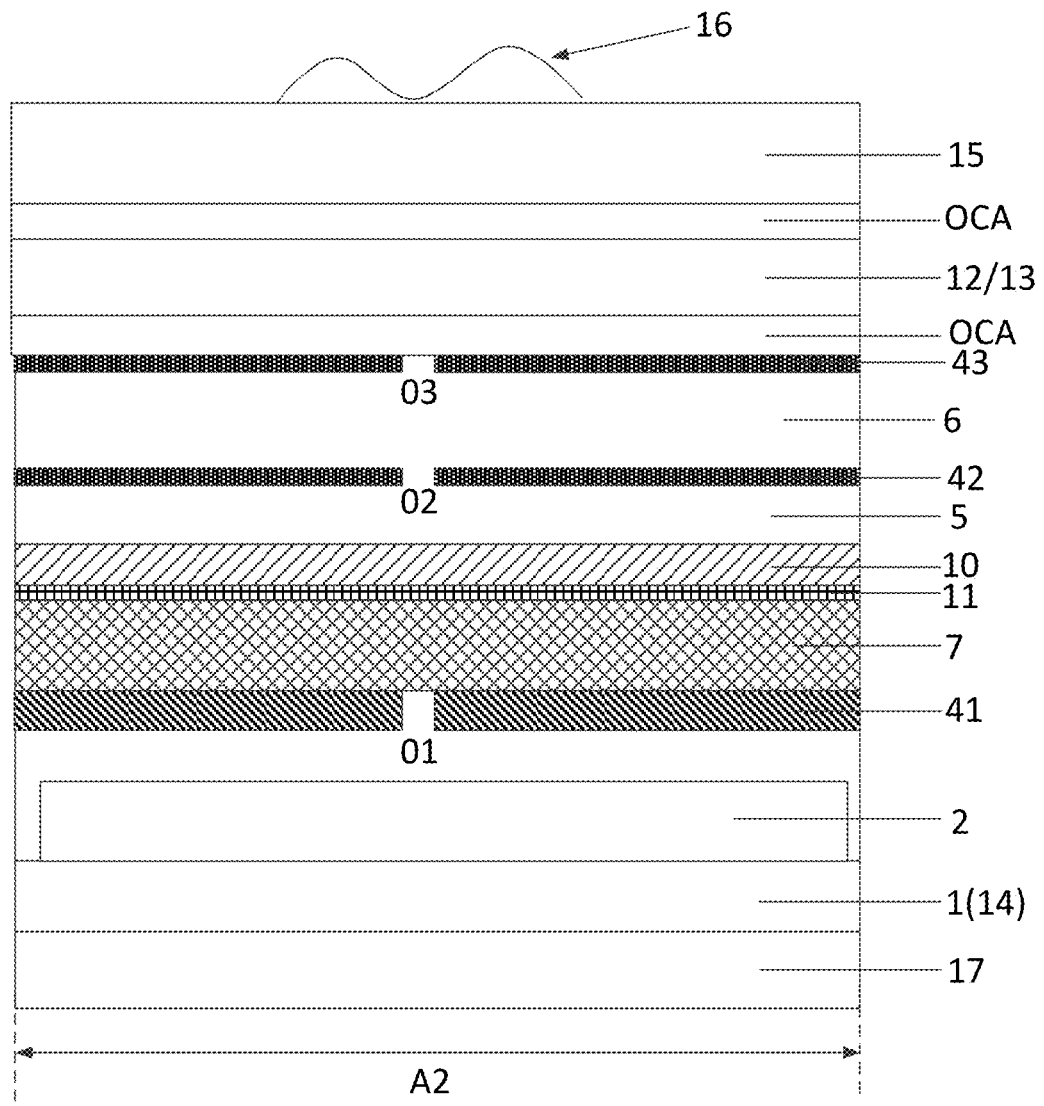
FIG. 3 is a schematic cross-sectional structure diagram of a non-sub-pixel region corresponding to FIG. 1.
Figure 4:
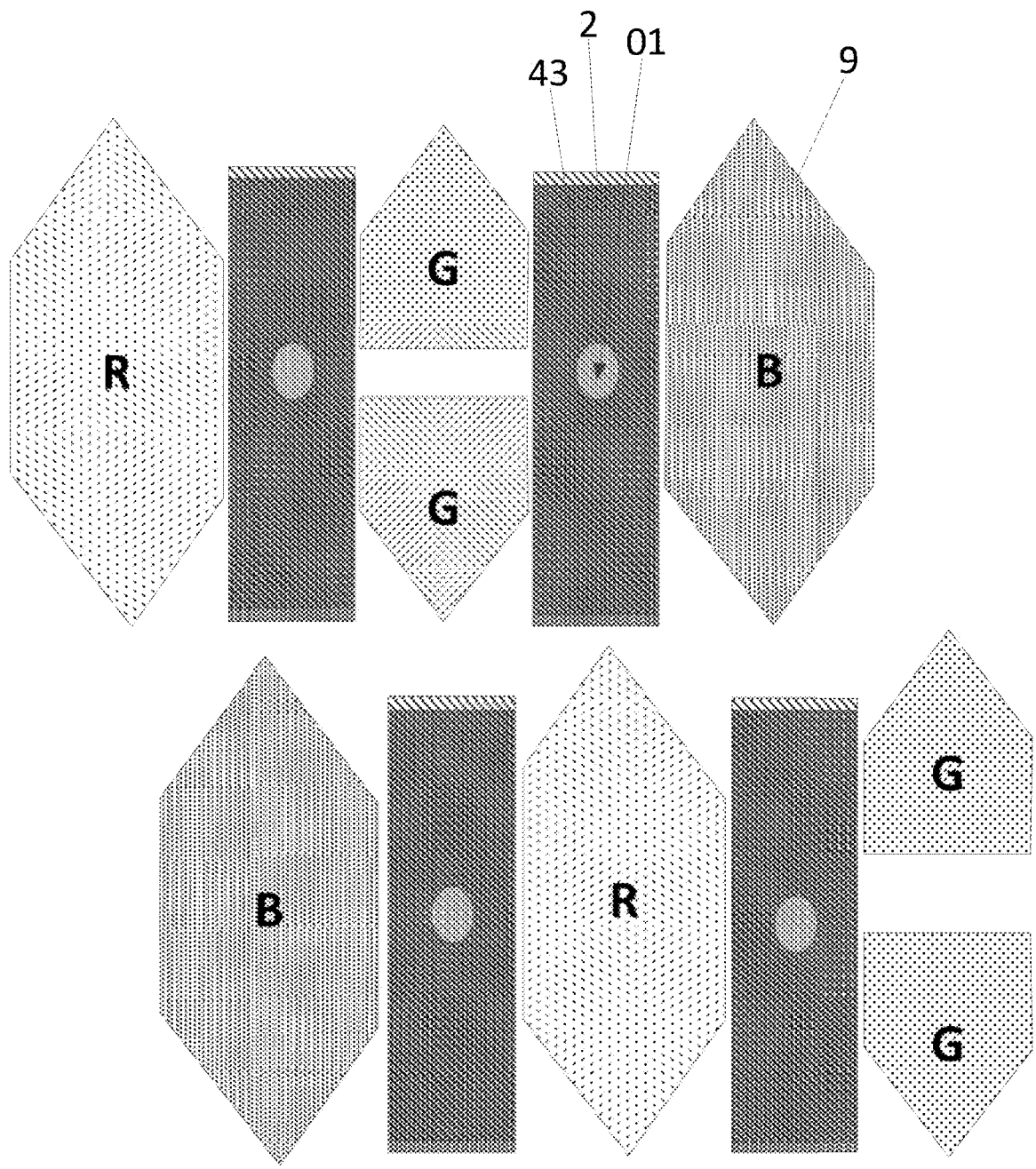
FIG. 4 is a schematic top view corresponding to FIG. 3.
Figure 5:
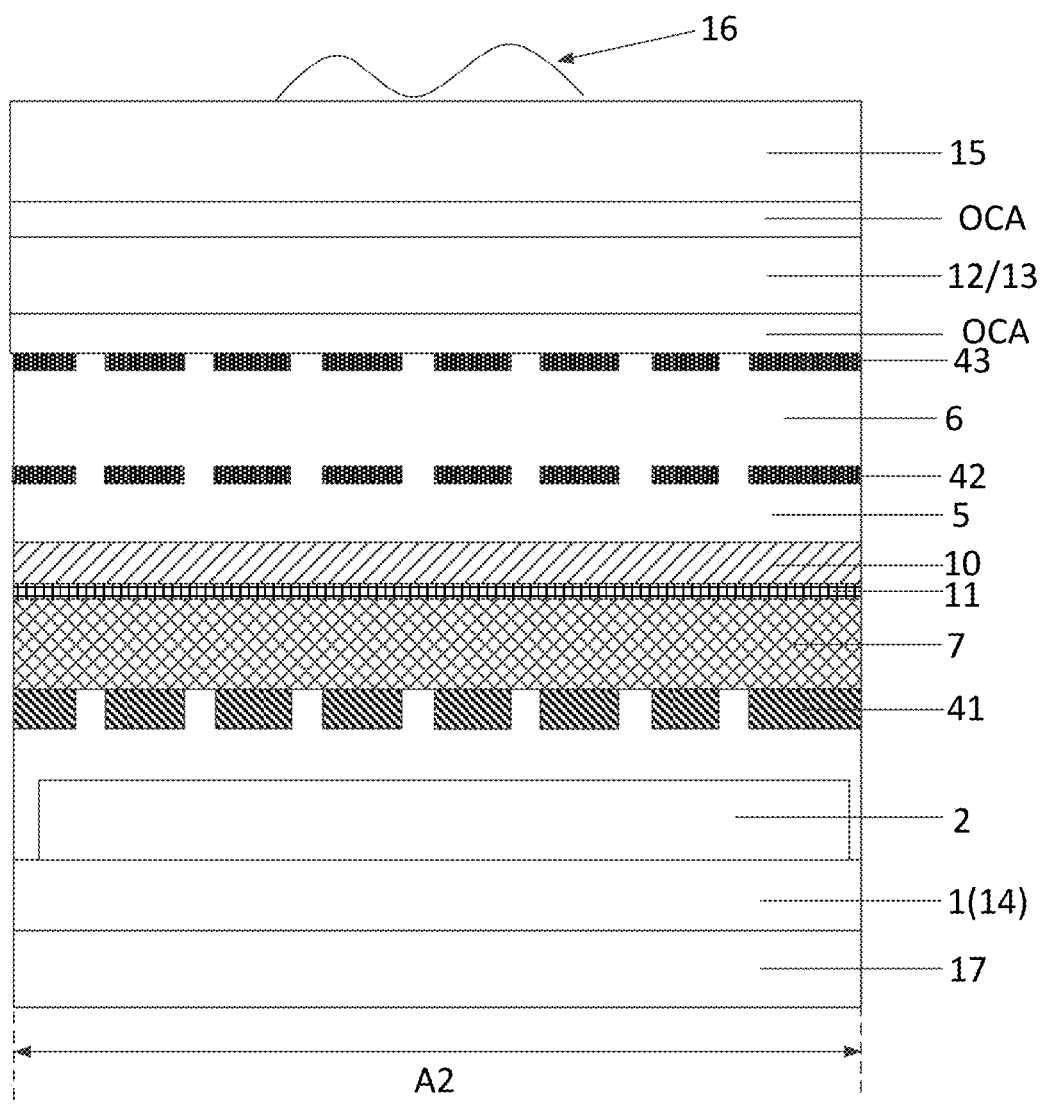
FIG. 5 is a schematic cross-sectional structure diagram of another non-sub-pixel region corresponding to FIG. 1.
Figure 6:
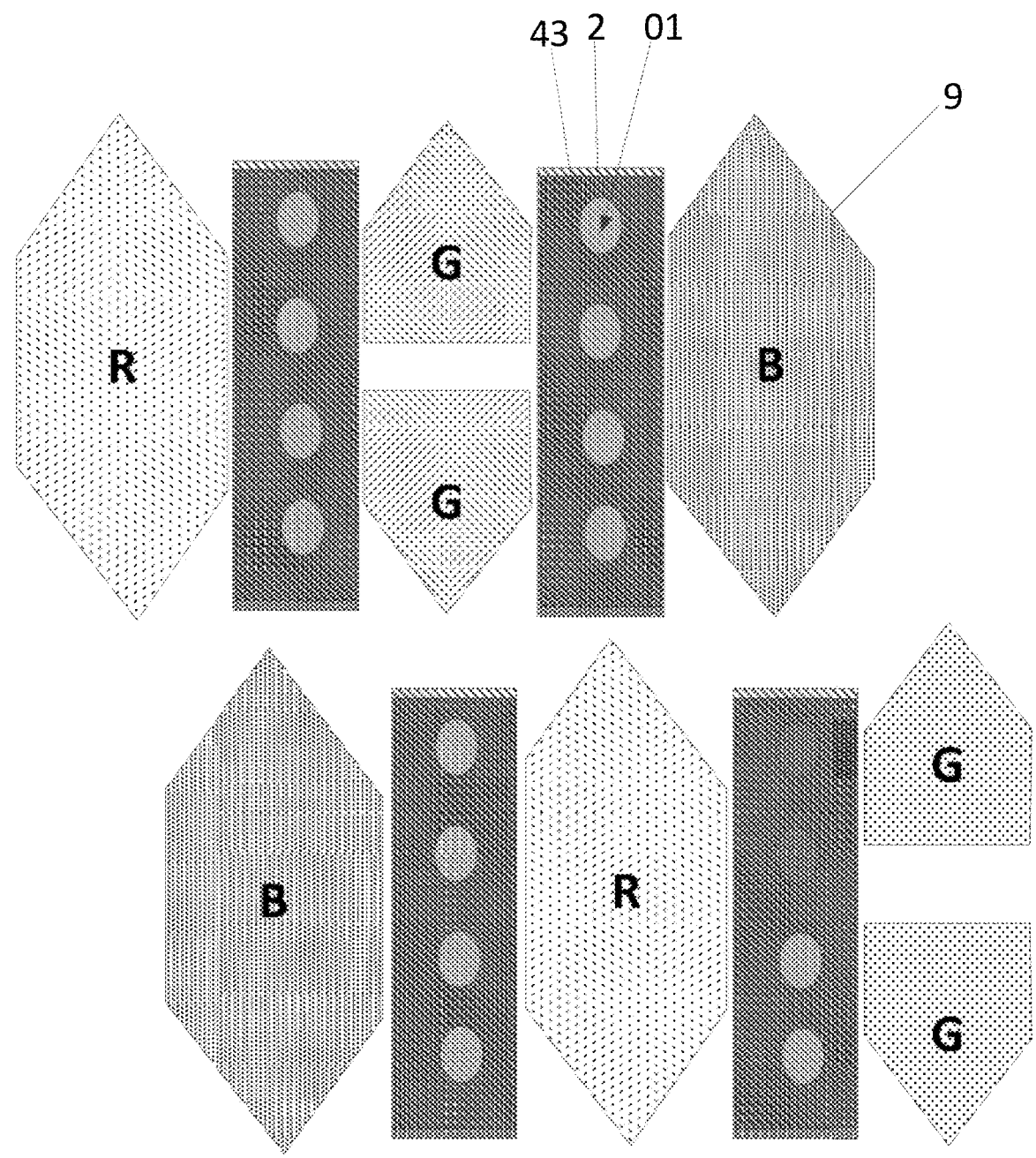
FIG. 6 is a schematic top view corresponding to FIG. 5.

In implementations, in the above-mentioned organic light-emitting display panel provided by the embodiments of the present disclosure, as shown in FIGS. 3 and 4, FIG. 3 is a schematic cross-sectional structure diagram of one non-sub-pixel region A2 in FIG. 1, and FIG. 4 is a schematic top view (one through hole) of a part of film layers corresponding to FIG. 1. One first through hole 01 is located in the position, corresponding to each fingerprint identification device 2, of the light-shielding layer 41, one second through hole 02 is located in the position, corresponding to each fingerprint identification device 2, of the light-shielding layer 42, and one third through hole 03 is located in the position, corresponding to each fingerprint identification device 2, of the light-shielding layer 43. The first through hole 01, the second through hole 02, and the third through hole 03 are in one-to-one correspondence. Through optical design, the first through hole 01, the second through hole 02, and the third through hole 03 may have a collimating function, may screen out light reflected by the finger in an approximately collimated manner, and make the light reach the fingerprint identification device 2 below, so as to realize fingerprint identification. FIG. 5 is a schematic cross-sectional structure diagram of one non-sub-pixel region A2 in FIG. 1, and FIG. 6 is a schematic top view (multiple through holes) of a part of film layers corresponding to FIG. 1. As shown in FIGS. 5 and 6, a plurality of through holes 01 are formed in the position, corresponding to each fingerprint identification device 2, of the light-shielding layer 41, a plurality of through holes 02 are located in the position, corresponding to each fingerprint identification device 2, of the light-shielding layer 42, and a plurality of through holes 03 are located in the position, corresponding to each fingerprint identification device 2, of the light-shielding layer 43. The first through hole 01, the second through hole 02, and the third through hole 03 at the same position are in one-to-one correspondence. Through optical design, the first through holes 01, the second through holes 02, and the third through holes 03 may have a collimating function, may screen out the light reflected by the finger in an approximately collimated manner, and make the light reach the fingerprint identification devices 2 below, so as to realize fingerprint identification. In some embodiments, orthographic projections of the first through hole 01, the second through hole 02 and the third through hole 03 on the base substrate 1 completely overlap as much as possible, but according to the alignment error of the actual manufacturing process, the through holes, at the same position, of the first light-shielding layer 41, the second light-shielding layer 42 and the third light-shielding layer 43 may have a certain offset, and may not completely overlap, i.e., partially overlap.

In implementations, the above-mentioned organic light-emitting display panel provided by the embodiments of the present disclosure, as shown in FIG. 1, further includes: a first encapsulation layer 5 located on sides, facing away from the base substrate 1, of the anodes 3, and a second encapsulation layer 6 located on a side, facing away from the base substrate 1, of the first encapsulation layer 5.

The second light-shielding layer 42 is located between the first encapsulation layer 5 and the second encapsulation layer 6, and the third light-shielding layer 43 is located on a side, facing away from the base substrate 1, of the second encapsulation layer 6. In some embodiments, the first encapsulation layer 5 and the second encapsulation layer 6 are each of an inorganic layer-organic layer-inorganic layer alternating structure, and both the first encapsulation layer 5 and the second encapsulation layer 6 are light-transmitting film layers. Thus, the light reflected from the finger may be incident to the fingerprint identification devices 2 through the through holes to realize fingerprint identification.

In implementations, in the above-described organic light-emitting display panel provided by the embodiments of the present disclosure, as shown in FIG. 1, the second light-shielding layer 42 and the third light-shielding layer 43 may be made of a black matrix (BM) material.

In implementations, the above-mentioned organic light-emitting display panel provided by the embodiments of the present disclosure, as shown in FIG. 2, further includes a pixel defining layer 7 located on the sides, away from the base substrate 1, of the anodes 3. The pixel defining layer 7 includes a colorful color resistance layer 71 and a black color resistance layer 72 which are laminated. The colorful color resistance layer 71 is close to the anodes 3, and the black color resistance layer 72 is away from the anodes 3. The pixel defining layer 7 has opening regions in one-to-one correspondence with the sub-pixel regions A1, the opening regions expose the anodes 3, and the black color resistance layer 72 may be multiplexed as the second light-shielding layer 42. Specifically, an original pixel defining layer 7 is generally colorful, and may filter out the ambient light reflected by the finger back to the fingerprint identification devices 2. The present disclosure replaces part of the original pixel defining layer 7 with the black color resistance layer 72, and thus the black color resistance layer 72 may be multiplexed as the second light-shielding layer 42, which may further omit the production of one light-shielding layer, reduce the device thickness and reduce the cost.

In implementations, the above-mentioned organic light-emitting display panel provided by the embodiments of the present disclosure, as shown in FIG. 2, further includes an encapsulation layer 8 located on a side, facing away from the base substrate 1, of the pixel defining layer 7. The third light-shielding layer 43 is located on a side, facing away from the base substrate 1, of the encapsulation layer 8. In some embodiments, the encapsulation layer 8 is of an inorganic layer-organic layer-inorganic layer alternating structure, and the encapsulation layer 8 is a light-transmitting film layer. Thus, the light reflected from the finger may be incident to the fingerprint identification devices 2 through the through holes to realize fingerprint identification.

Figure 7:
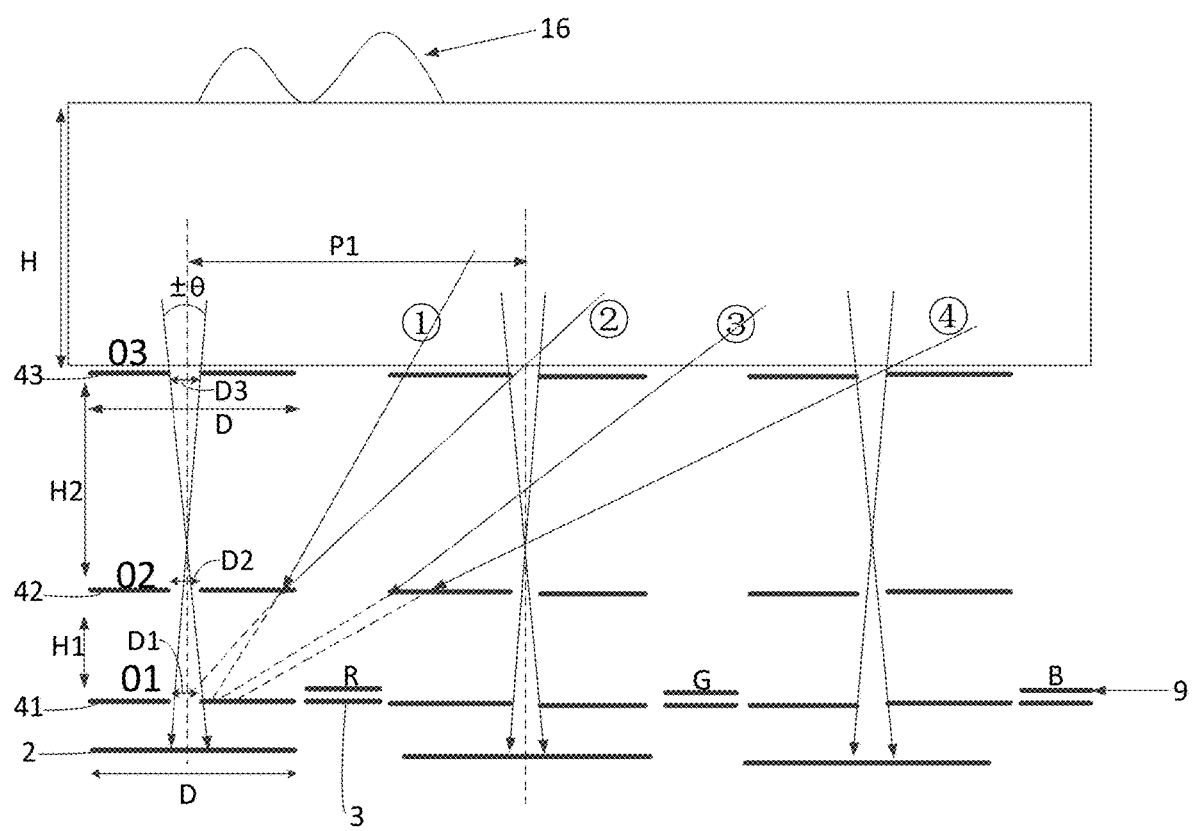
FIG. 7 is a schematic diagram of a collimation structure and principle analysis of anti-crosstalk.

In implementations, in the above-mentioned organic light-emitting display panel provided by the embodiments of the present disclosure, FIG. 7 is a schematic diagram of the collimation structure and principle analysis of anti-crosstalk, as shown in FIG. 7, completely overlapping regions of the orthographic projections of the first through hole 01, the second through hole 02, and the third through hole 03 corresponding to the same position of the first light-shielding layer 41, the second light-shielding layer 42 and the third light-shielding layer 43 on the base substrate 1 constitute a loop hole structure (i.e. the collimation structure), so that a role of collimating the light incident to the position at various angles is achieved, light with a certain range of angles (small angles) with a normal perpendicular to a surface of the collimation structure may pass through the loop hole structure, and light exceeding the range of angles (large angles) is cut off. The difference between the minimum angle and the maximum angle at which light may pass is a light collection angle $\theta$. In order to ensure that the light reflected from the finger may be incident to the fingerprint identification devices 2 as much as possible, the light collection angle $\theta$ of the collimation structure may be 10°-20°.

In implementations, in the above-mentioned organic light-emitting display panel provided by the embodiments of the present disclosure, as shown in FIG. 7, a distance H1 between a lower surface of the first light-shielding layer 41 and a lower surface of the second light-shielding layer 42 may be 5 μm-10 μm, and a distance H2 between the lower surface of the second light-shielding layer 42 and an upper surface of the third light-shielding layer 43 may be 10 μm-30 μm. In some embodiments, a film layer between the first light-shielding layer 41 and the second light-shielding layer 42, and a film layer between the second light-shielding layer 42 and the third light-shielding layer 43 are light-transmitting film layers (not shown in FIG. 7). The distance between the light-shielding layers is adjusted through the light-transmitting film layers, so that a distance (H1+H2) between the upper surface of the third light-shielding layer 43 and the lower surface of the first light-shielding layer 41 and diameters of the through holes (a diameter D1 of the first through hole 01, a diameter D2 of the second through hole 02 and a diameter D3 of the third through hole 03 being equal) are determined. Accordingly, a required depth-to-width ratio of the loop holes (01, 02 and 03) can be adjusted to limit the light collection angle $\theta$ of the collimation structure, thereby reaching the required collimation effect, and accurately obtaining the information of the valley and ridge of the fingerprint.

For example, as shown in FIG. 7, the thickness (H1+H2) between the upper surface of the top light-shielding layer (i.e. the third light-shielding layer 43) and the lower surface of the bottom light-shielding layer (i.e. the first light-shielding layer 41) of the collimation structure and the diameter D1 of the through holes (for example, the through holes 01) limit a range of the light collection angle θ: tan θ/2=D1/(H2+H1). In the fingerprint identification process, stray light at positions ①, ②, ③ and ④ and light behind may pass through the light-transmitting film layers between the first light-shielding layer 41 and the third light-shielding layer 43 to reach the fingerprint identification devices 2 under the collimation structure to cause the problem of blurring of an acquired image, which in turn leads to the problem of inaccuracy of the fingerprint information identified according to the light received by the fingerprint identification devices 2. Therefore, the middle light-shielding layer (i.e. the second light-shielding layer 42) needs to be provided to shield the crosstalk light, and then the light from the adjacent through holes is shielded or absorbed by the second light-shielding layer 42, so that the fingerprint identification devices 2 may not be affected by the stray light.

In implementations, in the above-mentioned organic light-emitting display panel provided by the embodiments of the present disclosure, as shown in FIG. 7, a distance P1 between the through holes at the same position in the different non-sub-pixel regions A2 may affect the transmittance of signal light received by the fingerprint identification devices 2 as well as the light crosstalk of the through holes of the adjacent light-shielding layers. For example, the stray light at the positions ①, ②, ③ and ④ in FIG. 7 interferes with the leftmost fingerprint identification device 2. Therefore, in order to improve the transmittance of the signal light received by the fingerprint identification devices 2 and avoid the light crosstalk of the through holes of the adjacent light-shielding layers, in the same light-shielding layer, the distance P1 between the adjacent through holes may be 20 μm-120 μm. In this way, the stray light at the positions ①, ②, ③ and ④ may be blocked by the second light-shielding layer 42 and is unable to enter the leftmost loop hole structure, so as not to affect the transmittance of the signal light received by the leftmost fingerprint identification device 2, thereby avoiding the light crosstalk of the through holes of the adjacent light-shielding layers.

Further, in implementations, in the above-mentioned organic light-emitting display panel provided by the embodiments of the present disclosure, as shown in FIG. 7, in order to prevent other light from reaching the fingerprint identification devices 2 from adjacent through holes and the sub-pixel regions A1, and to block the interference of the stray light at the positions ①, ②, ③ and ④ in FIG. 7 with the fingerprint identification devices 2, the collimation structure satisfies the following relationship:

$$D/2H1 \geq (P1-D/2)/H2, \text{ i.e. } D(H1+H2) \geq 2H1P1 \quad (1), \text{ and}$$

$$(P1-D/2)/H1 \geq (P1+D/2)/H2, \text{ i.e. } P1 \geq D(H1+H2)/2(H2-H1) \quad (2).$$

By combining (1) and (2), the collimation structure satisfies the following equation:

$$D(H1+H2)/2H1 \leq P1 \leq D(H1+H2)/2(H2-H1) \quad (3)$$

D is a width of the fingerprint identification device 2, H1 is the distance between the lower surface of the first light-shielding layer 41 and the lower surface of the second light-shielding layer 42, H2 is the distance between the lower surface of the second light-shielding layer 42 and the upper surface of the third light-shielding layer 43, and P1 is the distance between the through holes in the adjacent non-sub-pixel regions in the same light-shielding layer.

The inventor of the present disclosure has found that after the equation (3) is satisfied, the problem of crosstalk of adjacent light may be avoided, and accurate fingerprint identification may be realized.

In implementations, as shown in FIG. 7, the width D of the fingerprint identification device 2 is equal to a width of the first light-shielding layer 41, the second light-shielding layer 42, and the third light-shielding layer 43 in a non-sub-pixel region, and may be 20 μm-100 μm.

Figure 8:
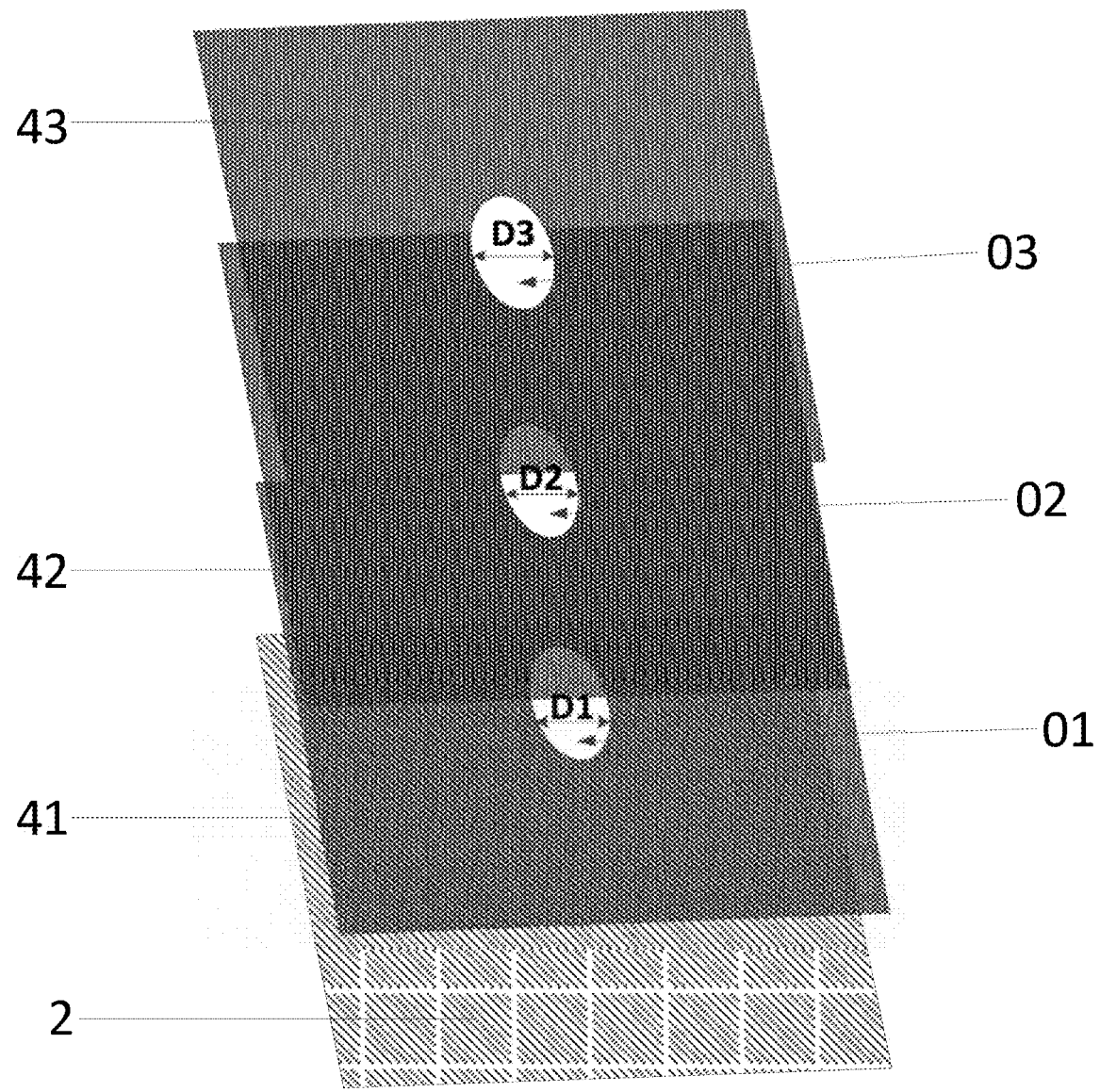
FIG. 8 is a schematic demonstration diagram of three light-shielding layers and a fingerprint identification device.

In implementations, in the above-mentioned organic light-emitting display panel provided by the embodiments of the present disclosure, the through holes in each light-shielding layer are generally arranged periodically, and the through holes may be circular, square, etc., which is not limited herein. FIG. 8 is a schematic demonstration diagram of the light-shielding layers (41, 42 and 43) and one fingerprint identification device 2, as shown in FIG. 8, when the through holes (01, 02 and 03) are circular, the diameters (D1, D2 and D3) are a diameter of a circle, and when the through holes are square, the diameters (D1, D2 and D3) are a side length of the square. In embodiments of the present disclosure, the through holes are circular as an example, the diameters (D1, D2 and D3 correspondingly) of the first through holes 01, the second through holes 02, and the third through holes 03 are the same, and are 1 μm-10 μm.

In implementations, in order to make the light reflected back by the finger incident to the fingerprint identification devices as much as possible, in the above-mentioned organic light-emitting display panel provided by the embodiments of the present disclosure, as shown in FIGS. 5 and 6, the plurality of through holes 01 are formed in the position, corresponding to each fingerprint identification device 2, of the light-shielding layer 41, the plurality of through holes 02 are located in the position, corresponding to each fingerprint identification device 2, of the light-shielding layer 42, and the plurality of through holes 03 are located in the position, corresponding to each fingerprint identification device 2, of the light-shielding layer 43. In addition, in order to facilitate manufacturing, the first through holes 01 are uniformly distributed, the second through holes 02 are uniformly distributed, and the third through holes 03 are uniformly distributed.

In implementation, the above-mentioned organic light-emitting display panel provided by the embodiments of the present disclosure, as shown in FIG. 1, further includes: a light-emitting layer 9 located between the anodes 3 and the first encapsulation layer 5, a cathode 10 located between the light-emitting layer 9 and the first encapsulation layer 5, and a spacer layer 11 located between the pixel defining layer 7 and the cathode 10.

In implementations, the above-mentioned organic light-emitting display panel provided by the embodiments of the present disclosure, as shown in FIG. 2, further includes: a light-emitting layer 9 located between the anodes 3 and the encapsulation layer 8, a cathode 10 located between the light-emitting layer 9 and the encapsulation layer 8, and a spacer layer 11 between the pixel defining layer 7 and the cathode 10.

In implementations, in the above-mentioned organic light-emitting display panel provided by the embodiments of the present disclosure, as shown in FIGS. 4, 6 and 7, the light-emitting layer 9 may include a red light-emitting layer R, a green light-emitting layer G, and a blue light-emitting layer B. The cathode 10 is a structure disposed on an entire surface. The spacer layer 11 plays a supporting role.

In implementations, the above-mentioned organic light-emitting display panel provided by the embodiments of the present disclosure, as shown in FIGS. 1 and 2, further includes a touch layer 12 and a polarizer 13 located on a side, facing away from the base substrate 1, of a light-shielding layer 4. In the present disclosure, the thickness of the organic light-emitting display panel may be reduced by integrating the touch layer 12 in the organic light-emitting display panel, and the polarizer 13 mainly plays a role of anti-glare.

In implementations, in the above-mentioned organic light-emitting display panel provided by the embodiments of the present disclosure, as shown in FIGS. 1 and 2, the touch layer 12 and the polarizer 13 may be independent film layers, or the touch layer 12 may be integrated on the polarizer 13, and the touch layer 12 may be bonded together with the third light-shielding layer 43 through optically clear adhesive (OCA).

In implementations, the above-mentioned organic light-emitting display panel provided by the embodiments of the present disclosure, as shown in FIGS. 1 and 2, further includes a driving circuit 14 located between the base substrate 1 and the fingerprint identification devices 2. The driving circuit 14 includes thin film transistor(s) (not shown), and the thin film transistor(s) is/are electrically connected to the fingerprint identification devices 2.

It should be noted that the positional relationship between the fingerprint identification devices 2 and the driving circuit 14 in the embodiments of the present disclosure in FIGS. 1 and 2 is only a schematic illustration, and the detailed circuit structure of the driving circuit and the electrical connection relationship of the driving circuit with the fingerprint identification devices 2 are the same as those in the related art and are not described in detail herein.

In implementations, the above-mentioned organic light-emitting display panel provided by the embodiments of the present disclosure, as shown in FIGS. 1 and 2, further includes a back film 17 on a side, facing away from the fingerprint identification devices 2, of the base substrate 1.

In the above-mentioned organic light-emitting display panel provided by the embodiments of the present disclosure, taking the organic light-emitting display panel shown in FIG. 1 as an example, the basic principle of fingerprint identification through the collimation structure is as follows.

When a finger 16 is in contact with a cover plate 15 (introduced in a display apparatus below), an OLED is controlled to light up a full screen and emit light, and after the light is emitted from the light-emitting layer 9, the light upwards passes through the first encapsulation layer 5, the second light-shielding layer 42, the second encapsulation layer 6, the third light-shielding layer 43, the optically clear adhesive (OCA), the touch layer 12, the polarizer 13, the cover plate 15 and other film layers to reach a fingerprint interface, namely a contact interface between the finger 16 and the cover plate 15, when light reflected and scattered back on the interface passes through the film layers and the first light-shielding layer 41, the light reflected by the finger 16 may be screened out in an approximately collimated manner through the first through holes 01, the second through holes 02 and the third through holes 03 so as to reach the fingerprint identification devices 2 below, and the fingerprint identification devices 2 may detect and read the intensity of the light. Because the valley and ridge of the finger 16 have different energies of downward transmitting the light, the light intensities detected by the fingerprint identification devices 2 are different, in this way, the fingerprint information is obtained.

The present disclosure adopts the at least two light-shielding layers with the through holes to form the collimation structure, each fingerprint identification device 2 corresponds to at least one set of through holes (taking the through holes 01-03 as an example) above, or correspond to multiple sets of through holes (the through holes 01-03), the distance between the light-shielding layers is adjusted through the light-transmitting film layers between the light-shielding layers, the distance between the top light-shielding layer and the bottom light-shielding layer and the apertures of the through holes are determined, and the required depth-to-width ratio of the loop holes is adjusted to limit the light collection angle θ of the collimation structure, thereby obtaining the required collimation effect, accurately obtaining the information of the valley and ridge of the fingerprint, and realizing the large-area fingerprint identification.

Based on the same disclosure concept, embodiments of the present disclosure also provide a display apparatus including the organic light-emitting display panel provided by the embodiments of the present disclosure. The principle by which the display apparatus solves the problem is similar to that of the afore-mentioned organic light-emitting display panel, and therefore the implementation of the display apparatus can be referred to the implementation of the afore mentioned organic light-emitting display panel, which will not be repeated here.

In implementations, the above-described display apparatus provided by the embodiments of the present disclosure may be a full-screen display apparatus, or may be a flexible display apparatus or the like, which is not limited thereto.

Figure 9:
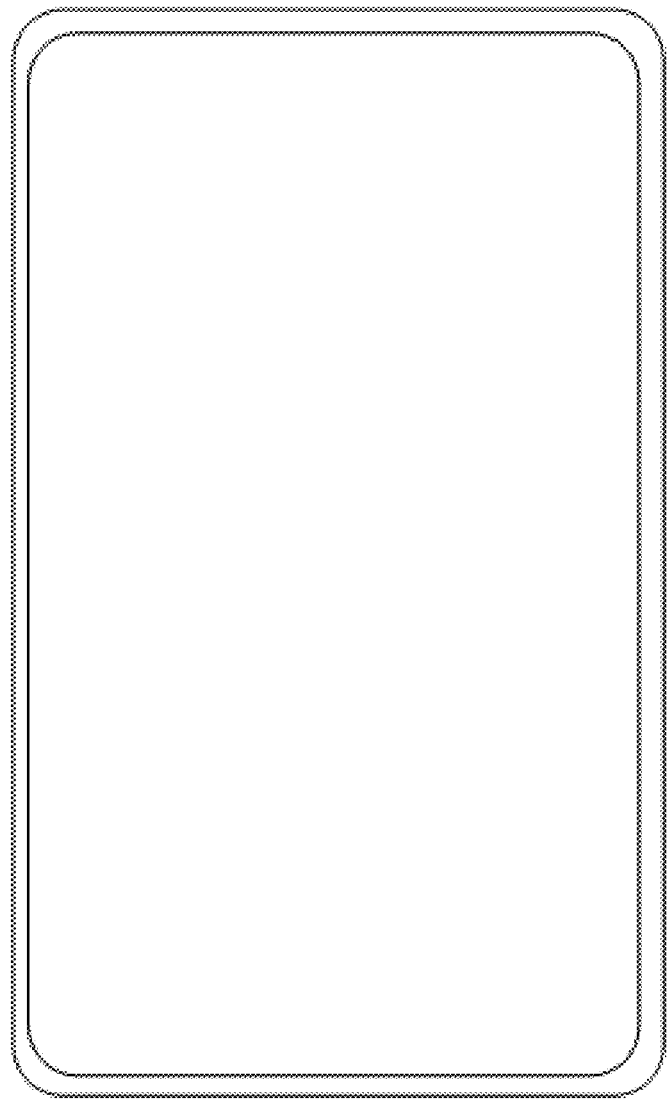
FIG. 9 is a schematic structural diagram of a display apparatus provided by an embodiment of the present disclosure.

In implementations, the display apparatus provided by the embodiments of the present disclosure may be a full-screen mobile phone as shown in FIG. 9. Alternatively, the display apparatus provided by the embodiments of the present disclosure may also be any product or component with a display function such as a tablet computer, a television, a display, a notebook computer, a digital photo frame, and a navigator. Other essential components of the display apparatus will be apparent to those of ordinary skill in the art and are not described in detail herein, nor should they be construed as limiting the present disclosure.

In implementations, the above-described display apparatus provided by the embodiments of the present disclosure, as shown in FIGS. 1 and 2, further includes the cover plate 15 located on a side, facing away from the base substrate 1, of the polarizer 13. The cover plate 15 is a flexible (such as PI) cover plate in order to reduce lightness and thinness of the display apparatus, and the cover plate 15 may be bonded together with the polarizer 13 by optically clear adhesive (OCA).

The above-mentioned organic light-emitting display panel provided by the embodiments of the present disclosure adopts the at least two light-shielding layers with the through holes to form the collimation structure. The at least two through holes corresponding to each other may screen out the light reflected by the finger in an approximately collimated manner, and make the light reach the fingerprint identification device below, and the fingerprint identification device may detect and read the intensity of the light. Because the valley and ridge of the fingerprint have different energies of downward transmitting the light, the light intensities detected by the fingerprint identification devices are different, in this way, the fingerprint information is obtained and the large-area fingerprint identification is realized. Moreover, when the collimation structure of the present disclosure has more than two light-shielding layers, the light collection angle of the collimation structures may be defined by the top light-shielding layer and the bottom light-shielding layer, and the middle light-shielding layer may be used to shield light crosstalk of the through holes in the different non-sub-pixels regions, thereby improving the accuracy of the identified fingerprint information. In addition, because only by preparing the at least two light-shielding layers with the through holes with a relatively simple structure may a better collimation effect be obtained, and the light-shielding layer closest to the base substrate is disposed in the same layer as and insulated from the anodes, the patterns of the bottom light-shielding layer and the anodes may be formed through the one-time patterning process, which simplifies the manufacturing process, saves production costs, and improves production efficiency.

Although the preferred embodiments of the present disclosure have been described, additional variations and modifications may be made to these embodiments by those skilled in the art once the basic inventive concept is known. Therefore, it is intended that the appended claims be interpreted as including the preferred embodiments and all alterations and modifications that fall within the scope of this disclosure.

It will be apparent to those skilled in the art that various modifications and variations can be made in the disclosed embodiments without departing from the spirit or scope of the disclosed embodiments. Thus, it is intended that the present disclosure cover the modifications and variations of this disclosure provided they come within the scope of the appended claims and their equivalents.

What is claimed is:

1. An organic light-emitting display panel, comprising:
    a base substrate, comprising:
        a plurality of sub-pixel regions; and
        a plurality of non-sub-pixel regions between the sub-pixel regions;
    a plurality of fingerprint identification devices in the non-sub-pixel regions of the base substrate;
    a plurality of anodes, in the sub-pixel regions and on sides, facing away from the base substrate, of the fingerprint identification devices; and
    a collimation structure in the non-sub-pixel regions;
    wherein the collimation structure comprises at least two laminated light-shielding layers, the at least two light-shielding layers are on the sides, facing away from the base substrate, of the fingerprint identification devices, and an orthographic projection of each light-shielding layer on the base substrate at least covers orthographic projections of the fingerprint identification devices on the base substrate; at least one through hole is located in a position, corresponding to each fingerprint identification device, of each light-shielding layer, and the through holes, corresponding to a same fingerprint identification device, of the light-shielding layers are in one-to-one correspondence; and the light-shielding layer closest to the base substrate is disposed in a same layer as and insulated from the anodes;
    wherein the collimation structure comprises a first light-shielding layer, a second light-shielding layer, and a third light-shielding layer which are laminated, the first light-shielding layer is close to the base substrate, the third light-shielding layer is away from the base substrate, and the first light-shielding layer is disposed in the same layer as and insulated from the anodes;
    at least one first through hole is located in a position, corresponding to each fingerprint identification device, of the first light-shielding layer, at least one second through hole is located in the position, corresponding to each fingerprint identification device, of the second light-shielding layer, at least one third through hole is located in the position, corresponding to each fingerprint identification device, of the third light-shielding layer, and the first through hole, the second through hole and the third through hole at the same position are in one-to-one correspondence; and
    wherein the organic light-emitting display panel further comprises: a pixel defining layer on sides, facing away from the base substrate, of the anodes; wherein the pixel defining layer comprises a colorful color resistance layer and a black color resistance layer which are laminated, the colorful color resistance layer is in contact with the black color resistance layer, a color of the colorful color resistance layer is different from a color of the black color resistance layer, the colorful color resistance layer is close to the anodes, and the black color resistance layer is away from the anodes; and the pixel defining layer has opening regions in one-to-one correspondence with the sub-pixel regions, and the black color resistance layer is multiplexed as the second light-shielding layer.

2. The organic light-emitting display panel according to claim 1, further comprising:
    a first encapsulation layer on sides, facing away from the base substrate, of the anodes; and
    a second encapsulation layer on a side, facing away from the base substrate, of the first encapsulation layer;
    wherein the second light-shielding layer is between the first encapsulation layer and the second encapsulation layer, and the third light-shielding layer is on a side, facing away from the base substrate, of the second encapsulation layer.

3. The organic light-emitting display panel according to claim 2, wherein the second light-shielding layer and the third light-shielding layer are made of a black matrix material.

4. The organic light-emitting display panel according to claim 1, further comprising:
    an encapsulation layer on a side, facing away from the base substrate, of the pixel defining layer;
    wherein the third light-shielding layer is on a side, facing away from the base substrate, of the encapsulation layer.

5. The organic light-emitting display panel according to claim 4, further comprising:
    a light-emitting layer between the anodes and the encapsulation layer;
    a cathode between the light-emitting layer and the encapsulation layer; and
    a spacer layer between the pixel defining layer and the cathode.

6. The organic light-emitting display panel according to claim 1, wherein a light collection angle of the collimation structure ranges from 10° to 20°.

7. The organic light-emitting display panel according to claim 1, wherein the collimation structure satisfies an equation of:

$$D(H1+H2)/2H1 \le P1 \le D(H1+H2)/2(H2-H1);$$

wherein D is a width of the fingerprint identification device, H1 is a distance between a lower surface of the first light-shielding layer and a lower surface of the second light-shielding layer, H2 is a distance between the lower surface of the second light-shielding layer and an upper surface of the third light-shielding layer, and P1 is a distance between the through holes, in the adjacent non-sub-pixel regions, of the same light-shielding layer.

8. The organic light-emitting display panel according to claim 1, wherein diameters of the first through hole, the second through hole and the third through hole are the same, and are 1 µm-10 µm.

9. The organic light-emitting display panel according to claim 1, wherein a distance between the first light-shielding layer and the second light-shielding layer is 5 µm-10 µm, and a distance between the second light-shielding layer and the third light-shielding layer is 10 µm-30 µm.

10. The organic light-emitting display panel according to claim 1, wherein in the same light-shielding layer, a distance between the adjacent through holes is 20 µm-120 µm.

11. The organic light-emitting display panel according to claim 1, wherein a plurality of first through holes are in the position, corresponding to each fingerprint identification device, of the first light-shielding layer, a plurality of second through holes are in the position, corresponding to each fingerprint identification device, of the second light-shielding layer, and a plurality of third through holes are in the position, corresponding to each fingerprint identification device, of the third light-shielding layer; and the first through holes are uniformly distributed, the second through holes are uniformly distributed, and the third through holes are uniformly distributed.

12. The organic light-emitting display panel according to claim 1, further comprising:
    a touch layer; and
    a polarizer;
    wherein the touch layer and the polarizer are on a side, facing away from the base substrate, of the light-shielding layers.

13. The organic light-emitting display panel according to claim 1, further comprising:
    a driving circuit between the base substrate and the fingerprint identification devices;
    wherein the driving circuit comprises a thin film transistor, and the thin film transistor is electrically connected to the fingerprint identification devices.

14. A display apparatus, comprising the organic light-emitting display panel according to claim 1.

15. The display apparatus according to claim 14, further comprising:
    a cover plate on a side, facing away from a base substrate, of a polarizer;
    wherein the cover plate is a flexible cover plate.

* * * * *